United States Patent
Inoue et al.

(10) Patent No.: US 8,174,180 B2
(45) Date of Patent: May 8, 2012

(54) LIGHT-EMITTING DEVICE HAVING SCATTERING REFLECTOR WITH PRESET SQUARE AVERAGE INCLINATION

(75) Inventors: Tetsuo Inoue, Yokohama (JP); Hajime Takeuchi, Yokohama (JP); Yasumasa Ooya, Chigasaki (JP); Toshio Shimaoogi, Hiratsuka (JP); Yasuhiro Shirakawa, Yokohama (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 0 days.

(21) Appl. No.: 13/007,089

(22) Filed: Jan. 14, 2011

(65) Prior Publication Data

US 2011/0109222 A1 May 12, 2011

Related U.S. Application Data

(63) Continuation of application No. PCT/JP2009/003334, filed on Jul. 15, 2009.

(30) Foreign Application Priority Data

Jul. 17, 2008 (JP) ................................. 2008-185870

(51) Int. Cl.
*H05B 33/02* (2006.01)
(52) U.S. Cl. .................................. 313/503; 362/296.01
(58) Field of Classification Search .................. None
See application file for complete search history.

(56) References Cited

U.S. PATENT DOCUMENTS

| 5,657,159 | A  | * | 8/1997  | Natori ............................ 359/448 |
| 7,479,665 | B2 |   | 1/2009  | Takine |
| 2004/0227462 | A1 |   | 11/2004 | Utsumi |
| 2006/0186806 | A1 |   | 8/2006  | Utsumi |
| 2007/0247855 | A1 |   | 10/2007 | Yano |

FOREIGN PATENT DOCUMENTS

| JP | 2004-342552 A | 12/2004 |
| JP | A 2006-229007 | 8/2006 |
| WO | WO 2006/038543 A1 | 4/2006 |

OTHER PUBLICATIONS

International Preliminary Report on Patentability and Written Opinion (English translation only) issued Feb. 17, 2011, in International Application No. PCT/JP2009/003334 (International Filing date Jul. 15, 2009).
International Search Report issued Aug. 11, 2009 in PCT/JP2009/003334 filed Jul. 15, 2009 (with English Translation).
International Written Opinion issued Aug. 11, 2009 in PCT/JP2009/003334 filed Jul. 15, 2009.

* cited by examiner

*Primary Examiner* — Toan Ton
*Assistant Examiner* — Britt D Hanley
(74) *Attorney, Agent, or Firm* — Oblon, Spivak, McClelland, Maier & Neustadt, L.L.P.

(57) ABSTRACT

A light emitting device 1 includes a light emitting diode, a phosphor layer containing phosphors that emit a visible light by being excited by a light emitted from the light emitting diode, and a reflector disposed to surround the light emitting diode. A portion of 50% or more in an area ratio of a reflecting surface of the reflector is formed as a scattering surface with a mean square inclination ($\Delta q$) (0.1 mm) in a range of not less than 0.003 nor more than 0.03.

12 Claims, 4 Drawing Sheets

SHORTEST DISTANCE BETWEEN
CHIP AND REFLECTOR (μm)

INCLINATION ANGLE OF
REFLECTING SURFACE (deg)

LIGHT-EMITTING DEVICE HAVING SCATTERING REFLECTOR WITH PRESET SQUARE AVERAGE INCLINATION

CROSS-REFERENCE TO RELATED APPLICATION

This application is a continuation of prior International Application No. PCT/JP2009/003334, filed on Jul. 15, 2009 which is based upon and claims the benefit of priority from Japanese Patent Application No. 2008-185870, filed on Jul. 17, 2008; the entire contents of all of which are incorporated herein by reference.

FIELD

Embodiments described herein relate generally to a light emitting device, and a backlight, a liquid crystal display device and an illumination device using the same.

BACKGROUND

A light emitting device using a light emitting diode chip (LED chip) is used as a backlight for a liquid crystal display device (LCD), an illumination device and the like. Particularly, since it becomes possible to realize a white light emitting device by combining a blue LED chip and a yellow phosphor, the device is rapidly put into use in respective fields. LCDs are applied to various displays of televisions, personal computers, mobile phones, car navigation systems and the like. In order to deal with environmental problems, also in an illumination device, switching from an incandescent lamp to a light emitting device using an LED chip is promoted.

When compared to conventional cold cathode tube and incandescent lamp, the light emitting device using the LED chip can realize energy saving, so that development thereof in the future is expected. Further, there is also a great expectation not only for energy saving but also for space saving, regarding the application of LED chip to the LCD and the illumination device. In order to deal with the space saving, namely, reduction in thickness and miniaturization, light emitting devices of surface-mount type and side-view type are developed. In either device, a light emitting diode chip is mounted on an accommodating container called a package, thereby realizing the space saving.

The surface-mount type is structured as a light emitting device in which an electrode and an LED chip are integrally formed on a substrate so that they can be directly connected to a mounting substrate. The side-view type is structured such that a light emitting direction is set to be horizontal with respect to a mounting face (for example, see JP-A 2006-229007 (KOKAI)). A package-shaped light emitting device is, as typified by the surface-mount type and the side-view type, a light source on which 1 to 2 pieces of LED chips are mounted, so that the device is provided with a reflecting member having a reflecting surface called a reflector in a package in order to enhance its light emission efficiency.

In order to increase a reflectance, mirror polishing has been conventionally performed on the reflecting member so that a surface roughness Ra becomes about 5 μm. However, although a regular reflectance is increased by a mirror surface, it is insufficient in terms of enhancement of light emission efficiency. A light emitting device in recent years using an LED chip reproduces various colors such as a white color by combining the LED chip and a phosphor layer. With the use only of the regular reflectance, a light from the LED chip does not uniformly reach the phosphor layer, so that there is a limit in the enhancement of the light emission efficiency, which is being clarified.

DETAILED DESCRIPTION

In one embodiment, a light emitting device include a light emitting diode, a phosphor layer containing phosphors that emit a visible light by being excited by a light emitted from the light emitting diode, and a reflector being disposed to surround the light emitting diode and having a reflecting surface. A portion of 50% or more in an area ratio of the reflecting surface of the reflector is formed as a scattering surface with a mean square inclination ($\Delta q$) (0.1 mm) in a range of not less than 0.003 nor more than 0.03.

In one embodiment, a backlight includes the light emitting device according to the embodiment. A liquid crystal display device includes the backlight according to the embodiment. An illumination device includes the light emitting device according to the one embodiment.

Figure 1:
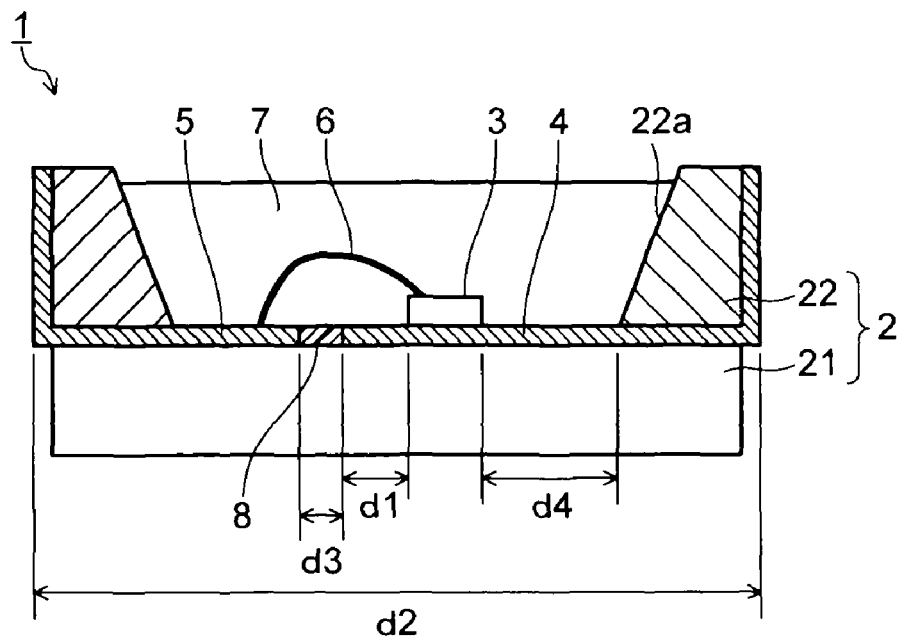
FIG. 1 is a sectional view showing a light emitting device according to an embodiment.
Figure 2:
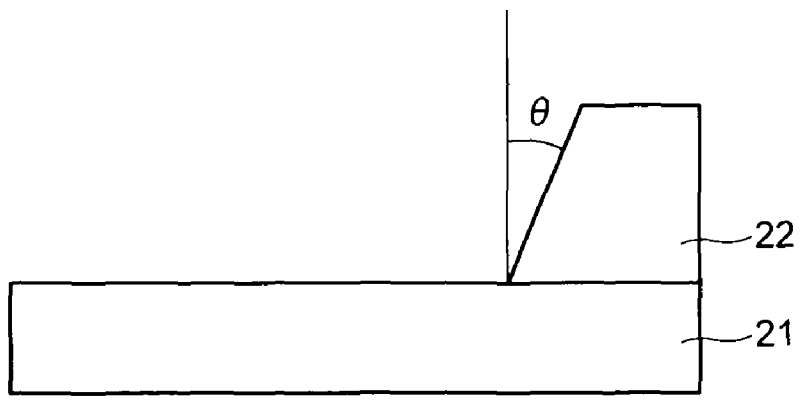
FIG. 2 is a view showing a reflector in the light emitting device shown in FIG. 1.

Hereinafter, embodiments will be described. FIG. 1 is a sectional view showing the light emitting device according to the embodiment. FIG. 2 is a view showing a part of the reflector in the light emitting device shown in FIG. 1.

In these drawings, 1 denotes a light emitting device, 2 denotes a package main body, 21 denotes a substrate, 22 denotes a reflector, 22a denotes a reflecting surface, 3 denotes a light emitting diode (LED) chip, 4 denotes a first electrode, 5 denotes a second electrode, 6 denotes a bonding wire, 7 denotes a phosphor layer, and 8 denotes an insulating member. d1 denotes a distance between an end portion of the first electrode 4 on a side of the second electrode 5 and an end portion of the LED chip 3, d2 denotes a length in a longitudinal direction of a package, d3 denotes a width of a space between the first electrode 4 and the second electrode 5, and d4 denotes a shortest distance between the LED chip 3 and the reflecting surface 22a of the reflector 22. FIG. 1 shows an example of a package-shaped light emitting device having a side-view structure.

In the light emitting device 1 shown in FIG. 1, the package main body 2 has the substrate 21 and the reflector 22 integrated with the substrate 21. Other than the above structure, it is also possible to employ a structure in which the reflector 22 is bonded onto the substrate 21. On the substrate 21 that forms the package main body 2, the first electrode 4 and the second electrode 5 are provided. The first and the second electrodes 4, 5 are integrated with an external electrode. The LED chip 3 is mounted on the first electrode 4. The LED chip 3 is electrically connected to the second electrode 5 via a bonding wire 6.

Although an example in which the LED chip 3 and the second electrode 5 are wire-bonded is shown in FIG. 1, the structure of the light emitting device 1 is not limited to this. The light emitting device may also employ a structure in which the LED chip 3 and the first electrode 4 are wire-bonded, or a structure in which the LED chip 3 is wire-bonded to both the first electrode 4 and the second electrode 5.

The first electrode 4 and the second electrode 5 are electrodes for achieving continuity with the LED chip 3, and are formed of metal plates, metal films, metal layers or the like. As a material of the electrodes 4, 5, there can be cited a metal with high conductivity such as Cu and Al. When mounting the LED chip 3 on the first electrode 4, the LED chip 3 is bonded onto the first electrode 4 using solder or the like. The LED chip 3 and the second electrode 5 are conducted through wire bonding.

The first electrode 4 and the second electrode 5 are integrated with an external electrode provided along an external surface of the reflector 22. A portion along the external surface of the reflector 22 may also be provided separately using a metal member. Specifically, it is also possible to structure such that the metal member is bonded later, as long as it has continuity with the electrodes 4, 5 on a surface of the substrate 21. The first and the second electrodes 4, 5 may also be Cu plates (foils) or Al plates (foils) on which Ag films or Al films are formed.

The phosphor layer 7 includes a transparent resin and phosphors dispersed inside the resin. In order to obtain an intended emission color, it is possible to use phosphors with respective colors such as a blue phosphor, a green phosphor, a red phosphor and the like. To achieve a white color emission, phosphors in which the blue phosphor, the green phosphor and the red phosphor are mixed are used, for example. The phosphor emits a visible light by being excited by a light emitted from the LED chip 3. The phosphor layer 7 contains phosphors that emit lights of respective colors by being excited by, for example, an ultraviolet light, a purple light, a blue light and the like.

An emission peak wavelength of the LED chip 3 is not particularly limited. In order to obtain a light emission of respective colors such as a white color by combining the LED chip and the phosphor layer 7, it is preferable to use the LED chip 3 that emits a light ranging from an ultraviolet light to a blue light. The emission peak wavelength of the LED chip 3 is preferably in a range of 360 to 480 nm. In particular, an ultraviolet light emitting LED chip 3 is preferably used.

In the ultraviolet light emitting LED chip 3, an emission peak wavelength is 420 nm or less. The emission peak wavelength is more preferably in a range of 360 to 405 nm. When the emission peak wavelength is less than 360 nm, the ultraviolet light is too strong, which may deteriorate the phosphors. Meanwhile, when the emission peak wavelength exceeds 420 nm, and further, when it reaches 440 nm or more, a light emission efficiency of three-color mixed phosphors in which, for example, a blue phosphor, a green phosphor and a red phosphor are mixed, is reduced.

The first electrode 4 and the second electrode 5 are provided in the same plane, so that in order to prevent a loose connection, the insulating member 8 is provided in a space between the electrodes. As the insulating member 8, a material which hardly absorbs the ultraviolet light and is not deteriorated is preferably applied, and concretely, there can be cited a resin, a glass, a ceramics and the like having a resistance to ultraviolet light. As the resin having the resistance to ultraviolet light, a silicon-based resin, an epoxy-based resin, an amide-based resin can be indicated as examples. Further, the insulating member 8 preferably has a reflectance of ultraviolet light whose wavelength is 400 nm of not less than 30% nor more than 100%. Here, the reason why the ultraviolet light of 400 nm is set as a reference is because an optical property of a resin resistant to ultraviolet light currently placed on the market is measured under approximately 400 nm.

When the insulating member 8 has a reflecting effect with respect to the ultraviolet light, it can reflect the ultraviolet light from the LED chip 3. Accordingly, since a portion which has been conventionally likely to be deteriorated can be used as an ultraviolet light reflecting portion, the light emission efficiency is enhanced. The reflectance of ultraviolet light (wavelength of 400 nm) of the insulating member 8 is more preferably 40% or more. As a resin having the resistance to ultraviolet light as described above, a polyphthalamide resin (amide-based resin) can be cited. The polyphthalamide resin also has good handleability (viscosity, drying temperature, price and the like). Note that the reflectance corresponds to a total reflectance.

A material of the substrate 21 that forms the package main body 2 is not particularly limited as long as it has insulation performance. As material of the substrate 21, there can be cited a resin, a glass, a ceramics and the like. When the substrate 21 is formed of an insulating resin, it is possible to integrally mold the insulating member 8 and the substrate 21. The reflector 22 may be structured to be integrally molded with the substrate 21, or may also be structured to be bonded onto the substrate 21 later.

The reflector 22 has the reflecting surface 22a. The reflecting surface 22a is provided with a reflecting film according to need. As the reflecting film, a metal film of Ag, Al or the like is preferably used. When an Ag film or an Al film is employed, it is possible to increase a reflectance of light with a wavelength of 400 to 480 nm to be 90% or more. As a method of forming the metal film, a plating method, a vapor deposition method, a thermal spraying method, a bonding of metal foil and the like can be cited, but, it is not limited to these.

The reflector 22 preferably has the reflecting surface 22a whose inclination angle θ with respect to the substrate 21 is in a range of 0 to 40° so that it becomes easy to reflect the light from the LED chip 3 and the phosphor layer 7. The inclination angle θ of the reflecting surface 22a is shown in FIG. 2. In FIG. 2, when an inclination angle of the reflecting surface 22a with respect to the substrate 21 is vertical, θ equals 0°. As an inclination of the reflecting surface 22a becomes greater, the inclination angle θ of the reflecting surface 22a is increased.

When the inclination angle θ of the reflecting surface 22a is smaller than 0°, the light of the LED chip 3 and the phosphor layer 7 becomes difficult to be emitted to the outside, so that the light emission efficiency is reduced. On the other hand, when the inclination angle θ of the reflecting surface 22a exceeds 40°, the effect of improving efficiency provided by inclining the reflecting surface 22a becomes small, and besides, a size of the light emitting device 1 (package size) becomes large. For this reason, it is not preferable to increase the inclination angle θ of the reflecting surface 22a to be greater than 40°.

At least a part of the reflecting surface 22a of the reflector 22 is formed as a scattering surface. An effect of improving the light emission efficiency provided by the use of the scattering surface can be obtained when the inclination angle θ of the reflecting surface 22a is set to fall within a range of 0 to 20°, and further, the effect can be remarkably obtained when the angle is set to 0 to 10°. The effect of improving the light emission efficiency provided by the scattering surface becomes remarkable as the inclination angle θ of the reflecting surface 22a is reduced. Further, by reducing the inclination angle θ of the reflecting surface 22a of the reflector 22, it is possible to miniaturize the light emitting device 1. Specifically, it becomes possible to realize a light emitting device 1 with small size and high brightness.

In the light emitting device 1 of this embodiment, a portion of 50% or more in an area ratio of the reflecting surface 22a of the reflector 22 is formed as a scattering surface with a mean square inclination (Δq) (0.1 mm) in a range of not less than 0.003 nor more than 0.03. Preferably, a portion of 80% or more in the area ratio of the reflecting surface 22a is formed as the scattering surface. Further, it is more preferable that the scattering surface has the mean square inclination (Δq) (0.1 mm) in a range of not less than 0.008 nor more than 0.02.

When the mean square inclination (Δq) is less than 0.003, an effect of scattering light provided by the reflecting surface 22a cannot be sufficiently enhanced. Meanwhile, when the mean square inclination (Δq) exceeds 0.03, the scattering of light provided by the reflecting surface 22a becomes too much, resulting in that an efficiency of taking out light from the light emitting device 1 is reduced. Also in this case, it is not possible to sufficiently achieve the effect of improving the light emission efficiency of the light emitting device 1. The mean square inclination (Δq) of the scattering surface is more preferably not less than 0.008 nor more than 0.02.

By forming the reflecting surface 22a of the reflector 22 in a range of not less than 50% nor more than 100% as the scattering surface, it is possible to make the light from the LED chip 3 return to the phosphor layer 7 in a random order. Accordingly, the light from the LED chip 3 uniformly reaches inside the phosphor layer 7. As a result of this, an intensity of light emitted from the phosphor layer 7 becomes strong, which enables to enhance the light emission efficiency of the light emitting device 1. If the area ratio of the reflecting surface 22a to be the scattering surface is less than 50%, the effect of scattering light provided by the reflecting surface 22a and an effect of improving a light emission intensity based on the effect of scattering light are decreased.

In the light emitting device 1 that applies, as the LED chip 3, an ultraviolet light emitting LED whose peak wavelength is 420 nm or less, phosphors of three colors of a blue phosphor, a green phosphor and a red phosphor are used for obtaining a white light. In order to make the phosphors of respective colors emit lights, the light from the LED chip 3 has to be irradiated to the respective phosphors, so that the light emitting device 1 using the scattering surface is particularly effective. The light emitting device 1 is suitable for a white light emitting device that applies the ultraviolet light emitting LED chip 3.

In order to achieve the effect provided by the scattering surface, it is preferable that 50% or more, further, 80% or more of the reflecting surface 22a of the reflector 22 has a predetermined mean square inclination (Δq). The mean square inclination (Δq) is determined by a mathematical expression described below. Concretely, a sample with 100 μm (0.1 mm) is randomly taken out from a portion, out of the reflecting surface 22a of the reflector 22, on which surface treatment is performed for realizing the scattering of light. The sample with a length of 100 μm is divided into 20 pieces, and in each piece, ΔYi is measured under conditions of ΔX=5 μm, and n=20. ΔYi is a height per unit length (ΔX) in the long direction. ΔYi/ΔX corresponds to an inclination angle. A unit is radian.

[Mathematical expression 1]

$$\Delta q = \frac{1}{n-1}\left[\sum_{i=1}^{n-1}\left\{\tan^{-1}\left(\frac{\Delta Y i}{\Delta x}\right)\right\}^2\right]^{\frac{1}{2}}$$

The shortest distance d4 between the LED chip 3 and the reflecting surface 22a of the reflector 22 is preferably 0.2 mm or less. If there is too much distance between the LED chip 3 and the reflecting surface 22a of the reflector 22, the effect provided by the reflecting surface 22a becomes small. The distance d4 between the LED chip 3 and the reflecting surface 22a is more preferably 0.18 mm or less, and still more preferably 0.15 mm or less. Further, if the distance d4 between the LED chip 3 and the reflector 22 is too small, the mountability and the like of the LED chip 3 are reduced, so that the distance d4 is preferably 0.05 mm or more. The shortest distance between the LED chip 3 and the reflector 22 indicates a shortest distance, when measured as a straight distance, from an end portion of the LED chip 3 to the reflector 22.

Further, by reducing the distance d4 between the LED chip 3 and the reflector 22, it is possible to enhance the effect provided by the reflecting surface 22a. Accordingly, the light emitting device 1 of the embodiment is suitable for a package-shaped light emitting device having a surface-mount structure or a side-view structure. The package-shaped light emitting device is required to realize the miniaturization and the reduction in thickness. The light emitting device 1 of the embodiment is suitable for a small-sized package-shaped light emitting device having a length in a longitudinal direction of not less than 2 mm nor more than 3 mm.

Figure 3:
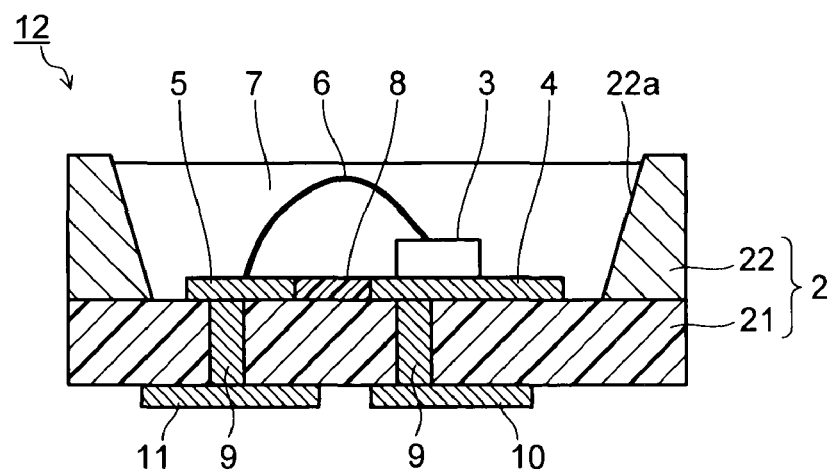
FIG. 3 is a sectional view showing a light emitting device according to another embodiment.

Next, another embodiment of the light emitting device will be described with reference to FIG. 3. FIG. 3 shows an example of a surface-mount type light emitting device. In the drawing, 2 denotes a substrate, 3 denotes an LED chip, 4 denotes a first electrode, 5 denotes a second electrode, 6 denotes a bonding wire, 7 denotes a phosphor layer, 8 denotes an insulating member, 9 denotes a through hole, 10 denotes a first electrode on a rear surface side, and 11 denotes a second electrode on the rear surface side. A light emitting device 12 shown in FIG. 3 is an example of a surface-mount type in which continuity between front and rear is achieved with the use of the through holes 9.

As the substrate 2 having the through holes 9, a resin circuit substrate obtained by forming a wiring layer in a resin substrate, a ceramics circuit substrate obtained by integrally forming a conductive layer made of tungsten or the like in through holes of a ceramics substrate with the use of a co-firing method, and the like can be cited. As a method which does not use the through holes 9, there can be cited a method in which electrodes (first and second electrodes 4, 5) are formed on side surfaces of a substrate, to thereby achieve continuity between front and rear surfaces. In the surface-mount type, by realizing the continuity between the front and rear surfaces of the substrate 2, the rear surface of the substrate 2 is formed as a mounting part. Therefore, it becomes possible to realize the reduction in thickness and the miniaturization of the light emitting device 1.

The light emitting devices 1, 12 of the above-described respective embodiments are provided with the reflector 22, and are suitable for package-shaped light emitting devices having the surface-mount structure, the side-view structure or the like. Further, since the effect is enhanced by reducing the distance between the LED chip 3 and the reflector 22, the devices are effectively used as small-sized light emitting devices 1, 12 in which a length in a longitudinal direction of a package is 2 to 3 mm, for example. Further, the devices are effectively used as light emitting devices 1, 12 provided with a phosphor layer 7 containing a plurality of phosphors such as a white light emitting device. Such light emitting devices 1, 12 are used as backlights for liquid crystal display devices, illumination devices and the like, and largely contribute to an improvement of a light emission efficiency of those devices.

Next, a manufacturing method of the light emitting devices 1, 12 of the embodiments will be described. The manufacturing method of the light emitting devices 1, 12 is not particularly limited as long as the reflecting surface 22a of the reflector 22 has a predetermined scattering surface. As a method of efficiently manufacturing the light emitting devices 1, 12 of the embodiments, the following manufacturing method can be cited.

When a surface of the reflector 22 is directly used as the reflecting surface 22a, a method in which the reflecting surface 22a is roughened to be adjusted with the use of a blast process or the like, can be cited. The blast process is a method of spraying a blast material (various abrasive grains) onto a surface of a product using compressed air. By adjusting a hardness and a size of the blast material, and a pressure and a period of time at the time of spraying, a predetermined surface can be obtained.

When the reflecting surface 22a is formed by providing a reflecting film such as an Ag film and an Al film on a surface of the reflector 22, a method of performing the blast process on the reflecting film can be cited. It is also possible to apply a method in which the blast process is performed on a base (surface of the reflector 22) before the reflecting film is provided thereon to form a predetermined roughened surface, and the reflecting film is provided with the use of a plating method or a vapor deposition method.

As a method which does not use the blast process, a method in which the reflector 22 is formed of a sintered body obtained by sintering ceramics powders and the like and the fired surface is directly used as the reflecting surface can be cited. It is also possible to apply a thermal spraying method as a method of forming the reflecting film. The thermal spraying is a method of forming a coating film by spraying a metal, ceramics and the like melted by a heat source such as combustion gas and arc plasma onto a surface to be coated. Since a molten material is sprayed, a roughened surface is easily obtained, compared to the plating method and the vapor deposition method. By controlling a condition at the time of thermal spraying, it is possible to obtain an intended surface.

The light emitting devices 1, 12 of the above-described embodiments can be used as illumination devices for various usages. As a typical example of use of the light emitting device, there can be cited a light source of a backlight for various display devices represented by a liquid crystal display device and a general illumination. By using the light emitting device as the light source, the brightness of the backlight and an illumination device can be improved. The backlight and the illumination device are structured by arranging a plurality of light emitting devices as a light source in a linear or matrix form. This does not mean to exclude the backlight and the illumination device that use only one light emitting device.

The backlight of the embodiment is suitably used as a backlight for a liquid crystal display device. The liquid crystal display device is provided with a flat liquid crystal panel as a flat panel display unit and a backlight which illuminates the liquid crystal panel from its back. The backlight is structured by disposing, for example, a plurality of light emitting devices directly below the liquid crystal panel. Alternatively, there is formed a side-view type backlight having a light source formed by arranging a plurality of light emitting devices in a linear form and a light guide plate.

EXAMPLES

Next, concrete examples and evaluation results thereof will be described.

Example 1

There was prepared an LED chip having an emission peak wavelength of 400 nm (half value width of 10 nm) as an ultraviolet light emitting diode. As a first electrode and a second electrode, there were prepared copper plates to which Ag-plating was applied, and they were integrally molded with a polyphthalamide resin, thereby assembling a main body part of the side-view type light emitting device shown in FIG. 1. An insulating member is formed of a polyphthalamide resin. A process was performed in a manner that a reflecting surface of a reflector made of a polyphthalamide resin was blast-processed by glass beads so that 90% of the reflecting surface was formed as a scattering surface having a predetermined mean square inclination ($\Delta q$).

Next, there were prepared a $Sr_{10}(PO_4)_6Cl_2$:Eu phosphor as a blue phosphor, a $BaMgAl_{10}O_{17}$:Eu, Mn phosphor as a green phosphor, and a $La_2O_2S$:Eu phosphor as a red phosphor. These phosphors were mixed with a silicon resin and then filled in the reflector to form a phosphor layer, thereby manufacturing the side-view type light emitting device that emits a white light.

Note that a space d3 between the first electrode and the second electrode and a length in a longitudinal direction of a package were unified to 0.17 mm (170 μm) and 2.8 mm, respectively. A size of the LED chip was set to 460 μm×260 μm, a size of the reflector was set to 2000 μm×600 μm, a shortest distance d4 between the LED chip and the reflector was set to 1.7 mm, and an inclination angle θ of the reflecting surface was set to 0°.

Figure 4:
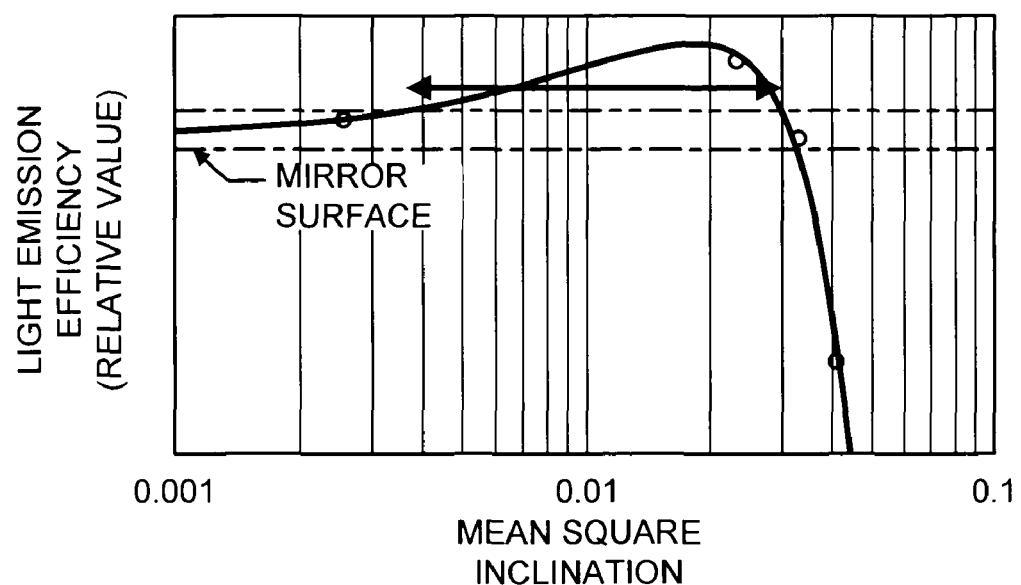
FIG. 4 is a view showing a relation between a mean square inclination ($\Delta q$) of a reflecting surface of a reflector and light emission efficiency in Example 1.

In such a light emitting device, a light emission efficiency at a time of changing the mean square inclination ($\Delta q$) of the reflecting surface of the reflector was measured. Results thereof are shown in FIG. 4. In FIG. 4, a horizontal axis indicates the mean square inclination ($\Delta q$), and a vertical axis indicates the light emission efficiency. The light emission efficiency is obtained by measuring how much of input electric energy can be converted into light energy, and is represented by a relative value. As is apparent from FIG. 4, it can be confirmed that when $\Delta q$ is in a range of 0.003 to 0.03, the light emission efficiency is stabilized at a high value. In particular, it can be confirmed that the light emission efficiency is excellent when $\Delta q$ is in a range of 0.008 to 0.02.

Example 2

There was prepared an LED chip having an emission peak wavelength of 390 nm (half value width of 10 nm) as an ultraviolet light emitting diode. As a first electrode and a second electrode, there were prepared copper plates to which Ag-plating was applied, and they were integrally molded with a polyphthalamide resin, thereby assembling a main body part of the surface-mount type light emitting device shown in FIG. 3. An insulating member is formed of a polyphthalamide resin. The Ag-plating was applied only to a portion exposed to the surface. A process was performed in a manner that a reflecting surface of a reflector made of a polyphthalamide resin was blast-processed by glass beads, and the Ag-plating was applied thereto so that 90% of the reflecting surface was formed as a scattering surface having a predetermined mean square inclination (Δq).

Next, there were prepared a $Sr_{10}(PO_4)_6Cl_2$:Eu phosphor as a blue phosphor, a $BaMgAl_{10}O_{17}$:Eu, Mn phosphor as a green phosphor, and a $La_2O_2S$:Eu phosphor as a red phosphor. These phosphors were mixed with a silicon resin and then filled in the reflector to form a phosphor layer, thereby manufacturing the surface-mount type light emitting device that emits a white light.

Note that a space d3 between the first electrode and the second electrode and a length in a longitudinal direction of a package were unified to 0.15 mm (150 μm) and 3 mm, respectively. A size of the LED chip was set to 460 μm×260 μm, a size of the reflector was set to 2000 μm×600 μm, a shortest distance d4 between the chip and the reflector was set to 1.7 mm, and an inclination angle of the reflecting surface was set to θ.

Figure 5:
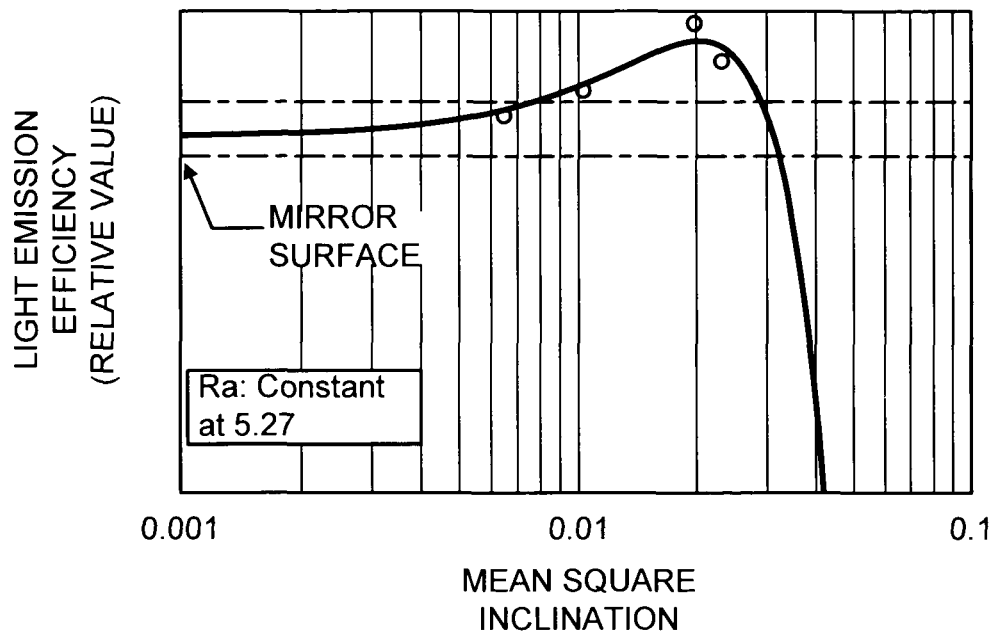
FIG. 5 is a view showing a relation between a mean square inclination ($\Delta q$) of a reflecting surface of a reflector and light emission efficiency in Example 2.

In such a light emitting device, a light emission efficiency at a time of changing the mean square inclination (Δq) of the reflecting surface of the reflector was measured. Results thereof are shown in FIG. 5. In FIG. 5, a horizontal axis indicates the mean square inclination (Δq), and a vertical axis indicates the light emission efficiency. The light emission efficiency is obtained by measuring how much of input electric energy can be converted into light energy, and is represented by a relative value. As is apparent from FIG. 5, it can be confirmed that when Δq is in a range of 0.003 to 0.03, the light emission efficiency is stabilized at a high value. In particular, it can be confirmed that the light emission efficiency is excellent when Δq is in a range of 0.008 to 0.02.

Comparative Example 1

In the light emitting device of the example 2, there was prepared a reflector whose reflecting surface was processed into a mirror surface with a surface roughness Ra of 5 μm. A surface-mount type light emitting device that emits a white light was manufactured in the same manner as the example 2, except that such a reflector was applied. Measured results of light emission efficiency obtained by such a light emitting device are collectively shown in FIG. 5. As is apparent from FIG. 5, it can be confirmed that the light emission efficiency is not improved only by processing the reflecting surface of the reflector into a mirror surface.

Example 3

Figure 6:
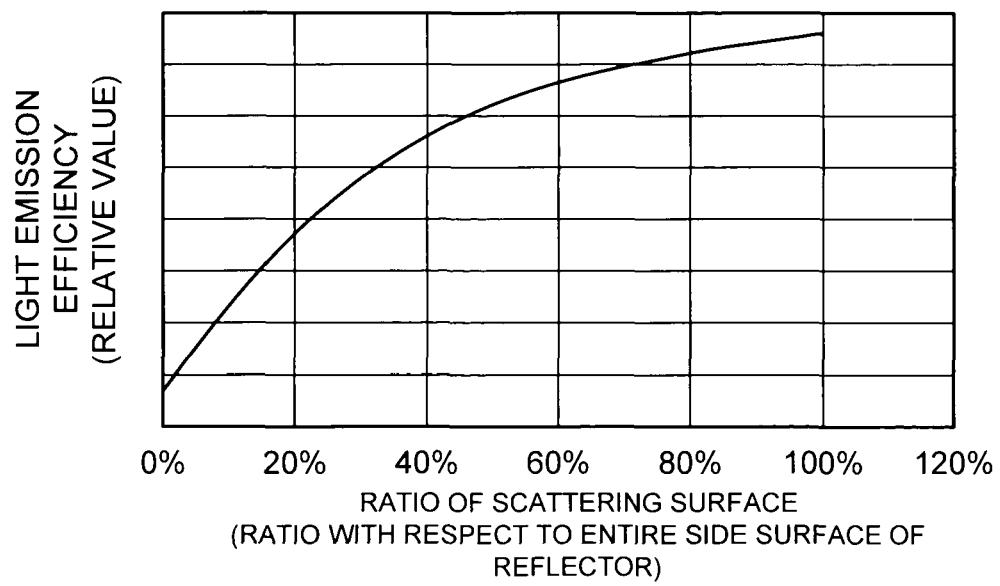
FIG. 6 is a view showing a relation between a ratio of a scattering surface of a reflecting surface of a reflector and light emission efficiency in Example 3.

In the light emitting device of the example 1, there was measured a light emission efficiency when a ratio of the scattering surface in the reflecting surface was changed. Results thereof are shown in FIG. 6. As is apparent from FIG. 6, it can be confirmed that the larger the ratio of the scattering surface is, the more the light emission efficiency is improved. In particular, by forming 50% or more, further, 80% or more of the reflecting surface as the scattering surface, it becomes possible to enhance the light emission efficiency of the light emitting device.

Example 4

Figure 7:
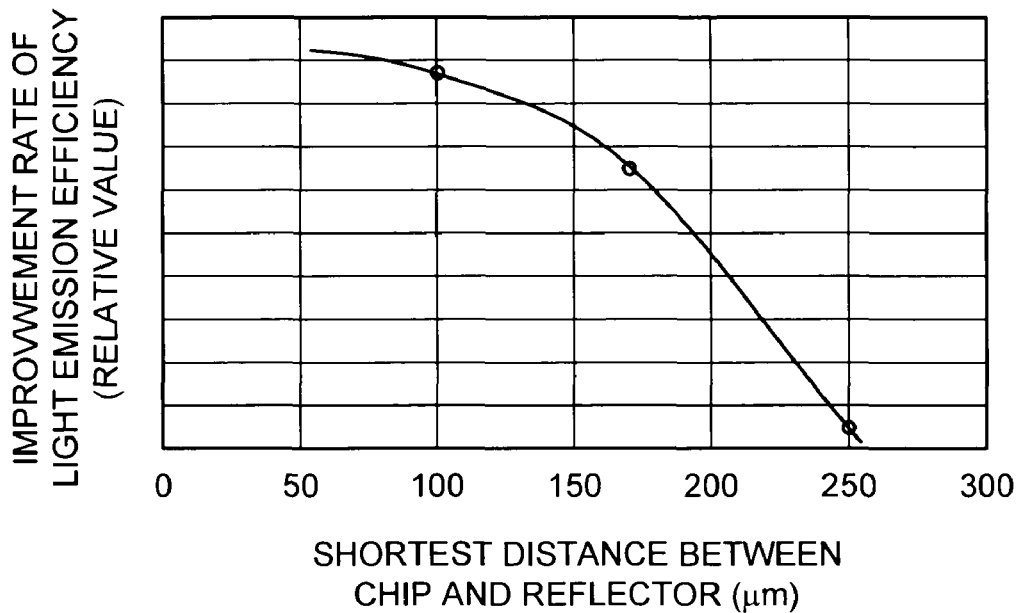
FIG. 7 is a view showing a relation between a shortest distance between an LED chip and a reflector and an improvement rate of light emission efficiency in Example 4.

In the light emitting device of the example 1, there was measured a light emission efficiency when the shortest distance d4 between the LED chip and the reflector was changed. Results thereof are shown in FIG. 7. As is apparent from FIG. 7, it can be confirmed that an improvement rate of the light emission efficiency of the light emitting device is high when the shortest distance d4 between the LED chip and the reflector was set to 200 μm or less (0.2 mm or less).

Example 5

Figure 8:
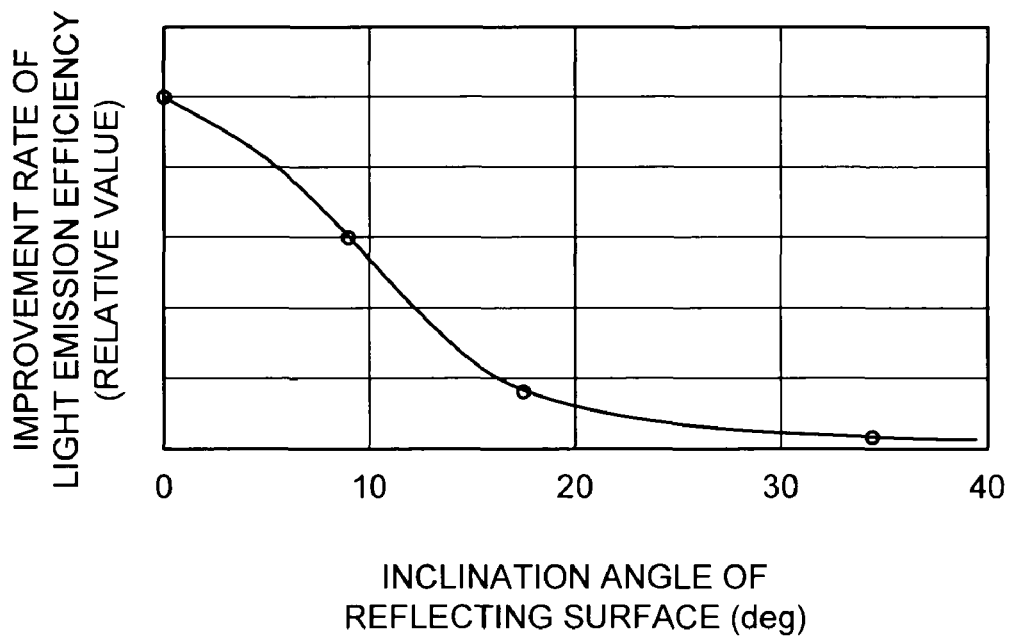
FIG. 8 is a view showing a relation between an inclination angle of a reflecting surface of a reflector and an improvement rate of light emission efficiency in Example 5.

In the light emitting device of the example 1, there was measured a light emission efficiency when the inclination angle θ of the reflecting surface was changed. Results thereof are shown in FIG. 8. As is apparent from FIG. 8, when the inclination angle θ of the reflecting surface was set to fall within a range of 0 to 20°, further, within a range of 0 to 10°, the improvement rate of the light emission efficiency of the light emitting device is high. Specifically, effectiveness can be seen particularly in a light emitting device in which an inclination angle of the reflector is small. By reducing the inclination angle of the reflector, it becomes possible to realize both the improvement of the light emission efficiency and the miniaturization of the light emitting device.

When a backlight for a liquid crystal display device and an illumination device were manufactured using the light emitting device of each example described above, it was confirmed to be able to realize both the miniaturization and the high brightness. Since the light emission efficiency is improved in the light emitting device of each example, when the device is used as a backlight for a liquid crystal display device and an illumination device, it is possible to enhance the light emission efficiency of the liquid crystal display device and the illumination device. The light emitting device of each example is suitable for respective products which use a plurality of light emitting devices, in particular.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light emitting device, comprising: a light emitting diode; a phosphor layer containing phosphors that emit a visible light by being excited by a light emitted from the light emitting diode; and a reflector being disposed to surround the light emitting diode and having a reflecting surface, wherein at least 50% in an area ratio of the reflecting surface of the reflector is formed as a scattering surface with a mean square inclination (Δq) in a range of not less than 0.003 nor more than 0.03.

2. The light emitting device according to claim 1, wherein at least 80% in the area ratio of the reflecting surface is formed as the scattering surface.

3. The light emitting device according to claim 1, wherein the mean square inclination (Δq) in the scattering surface is in a range of not less than 0.008 nor more than 0.02.

4. The light emitting device according to claim 1, wherein an inclination angle of the reflecting surface of the reflector is in a range of 0 to 40°.

5. The light emitting device according to claim 1, wherein a shortest distance between the light emitting diode and the reflecting surface of the reflector is 0.2 mm or less.

6. The light emitting device according to claim 1, wherein the light emitting diode has an emission peak wavelength of 420 nm or less.

7. The light emitting device according to claim 1, wherein the phosphor layer emits a white light.

8. The light emitting device according to claim 1, wherein the light emitting device is a package-shaped light emitting device having a surface-mount structure or a side-view structure.

9. The light emitting device according to claim 8, wherein a length in a longitudinal direction of the package-shaped light emitting device is not less than 2 mm nor more than 3 mm.

10. A backlight, comprising the light emitting device according to claim 1.

11. A liquid crystal display device, comprising the backlight according to claim 10.

12. An illumination device, comprising the light emitting device according to claim 1.

\* \* \* \* \*